(12) United States Patent
Osten et al.

(10) Patent No.: US 8,804,123 B2
(45) Date of Patent: Aug. 12, 2014

(54) INSPECTION METHOD AND APPARATUS, LITHOGRAPHIC APPARATUS, LITHOGRAPHIC PROCESSING CELL AND DEVICE MANUFACTURING METHOD

(75) Inventors: Wolfgang Max Adolf Bernhard Osten, Stuttgart (DE); Karsten Frenner, Leonberg (DE); Bartosz Jan Bilski, Stuttgart (DE)

(73) Assignee: ASML Netherlands B.V., Veldhoven (NL)

( * ) Notice: Subject to any disclaimer, the term of this patent is extended or adjusted under 35 U.S.C. 154(b) by 25 days.

(21) Appl. No.: 13/458,116

(22) Filed: Apr. 27, 2012

(65) Prior Publication Data

US 2013/0050700 A1    Feb. 28, 2013

Related U.S. Application Data (60) Provisional application No. 61/496,644, filed on Jun. 14, 2011.

(51) Int. Cl.
*G01J 4/00* (2006.01)

(52) U.S. Cl.
USPC .......................................................... 356/369

(58) Field of Classification Search
USPC .................. 356/600–601, 364–369, 273.1
See application file for complete search history.

(56) References Cited

U.S. PATENT DOCUMENTS

| | | | | |
|---|---|---|---|---|
| 2004/0160604 | A1* | 8/2004 | Meeks et al. | 356/364 |
| 2007/0252986 | A1* | 11/2007 | Sandstrom | 356/319 |
| 2008/0055597 | A1* | 3/2008 | Sun et al. | 356/369 |
| 2009/0021749 | A1* | 1/2009 | Yeo et al. | 356/601 |
| 2010/0265516 | A1* | 10/2010 | De Groot et al. | 356/511 |
| 2013/0114081 | A1* | 5/2013 | Fukazawa | 356/369 |

FOREIGN PATENT DOCUMENTS

EP    1 628 164 A2    2/2006

OTHER PUBLICATIONS

Bergner, B. C., et al., "Effect of Line-Width Roughness on Optical Scatterometry Measurements," Proceedings of the SPIE, Metrology, Inspection, and Process Control for Microlithography, vol. 7272, 2009; pp. 72720U-1 to 72720U-8.

Bergner, B. C., et al., "Effective medium approximations for modeling optical reflectance from gratings with rough edges," Journal of the Optical Society of America A, vol. 27, No. 5, May 2010; pp. 1083-1090.

Braun, A. E., "How CD-SEMs Complement Scatterometry," Semiconductor International, Jun. 2009; pp. 14-17.

Gallatin, G., "Short Course 886: Line Edge Roughness," SPIE Advanced Lithography, Feb. 21, 2010; pp. 25-37.

Mack, C. A., "Line Edge Roughness", Excerpt, Field Guide to Optical Lithography, SPIE Press, First Edition, 2006; 2 pages.

(Continued)

*Primary Examiner* — Gregory J Toatley
*Assistant Examiner* — Dominic J Bologna
(74) *Attorney, Agent, or Firm* — Sterne, Kessler, Goldstein & Fox P.L.L.C.

(57) ABSTRACT

Determining line edge roughness comprises reflecting at least one radiation beam off the object, observing a first optical response signature from a beam reflected from the object, or a component thereof, being polarized with an electrical vector in a first orientation relative to the object; and observing a second optical response signature from a beam reflected from the object, or a component thereof, being polarized with an electrical vector in a second orientation relative to the object. Line edge roughness can then be determined from the two optical response signatures.

18 Claims, 7 Drawing Sheets

(56) References Cited

OTHER PUBLICATIONS

Raymond, C. J., "Chapter 18: Scatterometry for Semiconductor Metrology," Handbook of Silicon Semiconductor Metrology, First Edition, 2001; 37 pages.

Schuster, T., "Simulation von Lichtbeugung an Kreuzgitterstrukturen und deren Anwendung in der Scatterometrie," PhD Thesis, Universitat Stuttgart, Jan. 2010; 200 pages.

Shibata, K., et al., "Influence of line-edge roughness on MOSFET devices with sub-50-nm gates," Proceedings of the SPIE, Metrology, Inspection, and Process Control for Microlithography XVIII, vol. 5375, 2004; pp. 865-873.

"The International Technology Roadmap for Semiconductors: Metrology," 2009 Edition; 40 pages.

Bilski, B., et al., "About the influence of Line Edge Roughness on measured *effective-CD*," Optics Express, vol. 19, No. 2, Oct. 10, 2011; pp. 19967-19972.

Bilski, B., "Sensitivity analysis of line-edge roughness measured by means of scatterometry: a simulation-based investigation," Proceedings of SPIE—Metrology, Inspection, and Process Control for Microlithography XXVI, vol. 8324, Apr. 4, 2012; pp. 83240J-1 to 83240J-9.

International Search Report directed to related International Patent Application No. PCT/EP2012/057380, mailed Aug. 28, 2012; 2 pages.

* cited by examiner

INSPECTION METHOD AND APPARATUS, LITHOGRAPHIC APPARATUS, LITHOGRAPHIC PROCESSING CELL AND DEVICE MANUFACTURING METHOD

CROSS REFERENCE TO RELATED APPLICATIONS

This application claims the benefit under 35 U.S.C. §119(e) to U.S. Provisional Patent Application No. 61/496, 644, filed Jun. 14, 2011, which is incorporated by reference herein in its entirety.

STATEMENT REGARDING FEDERALLY SPONSORED RESEARCH OR DEVELOPMENT

The work leading to this invention has received funding from the European Community's Seventh Framework Programme FP7/2007-2013 under grant agreement no. 215723. The government has certain rights in the invention.

FIELD

The present invention relates to methods of inspection usable, for example, in the manufacture of devices by lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

As the semiconductor industry still follows the Moore's Law the smallest feature-size, the so-called Critical Dimension (CD), of new-generation integrated circuits (ICs) is continuously shrinking Every next generation (so-called node) of lithography processes is facing even more difficult challenges than the previous one, an important example being so-called Line Edge Roughness (LER). For the nodes below 100 nm the edges of lithography-fabricated IC structures can no longer be assumed to be straight lines since their nanometer-scale variations become a non-negligible fraction of the overall structures' dimensions, rendering the edges "rough". The $3\sigma\_RMS$ value of the variations is what is called the Line Edge Roughness. When two rough edges form e.g., a line, its width is also statistically varying, this being known as Line Width Roughness (LWR). The relation between the two is:

$$\sigma_{LWR} = SQRT(2) * \sigma_{LER}$$

The foregoing will mean LER, not LWR, when referring to roughness, although both concepts are equally applicable of course. It has been observed that LER has a significant impact on lithography-fabricated devices, in that the more substantial the LER the worse the IC's performance. Moreover, LER is unlikely to scale down at the same rate as the CD does. From these observations it follows that having a shrinking CD (as is the case in every next lithography-generation) and constant LER, the latter becomes a more and more significant fraction of the overall CD error budget. Therefore, the CD control throughout the lithography-process becomes essentially a LER control. Consequently, there is a growing need to be able to determine the LER with sufficient precision.

SUMMARY

It is an object of the present invention to address one or more of the above issues It is desirable to provide a method of determining edge roughness.

According to an aspect of the invention, there is provided a method of determining a parameter related to the edge roughness of an object comprising: reflecting at least one radiation beam off the object, observing a first optical response signature from a beam reflected from the object, or a component thereof, being polarized with an electrical vector in a first orientation relative to the object, observing a second optical response signature from a beam reflected from the object, or a component thereof, being polarized with an electrical vector in a second orientation relative to the object, and determining the parameter related to the edge roughness of the object from the first and second optical responses.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Figure 1:
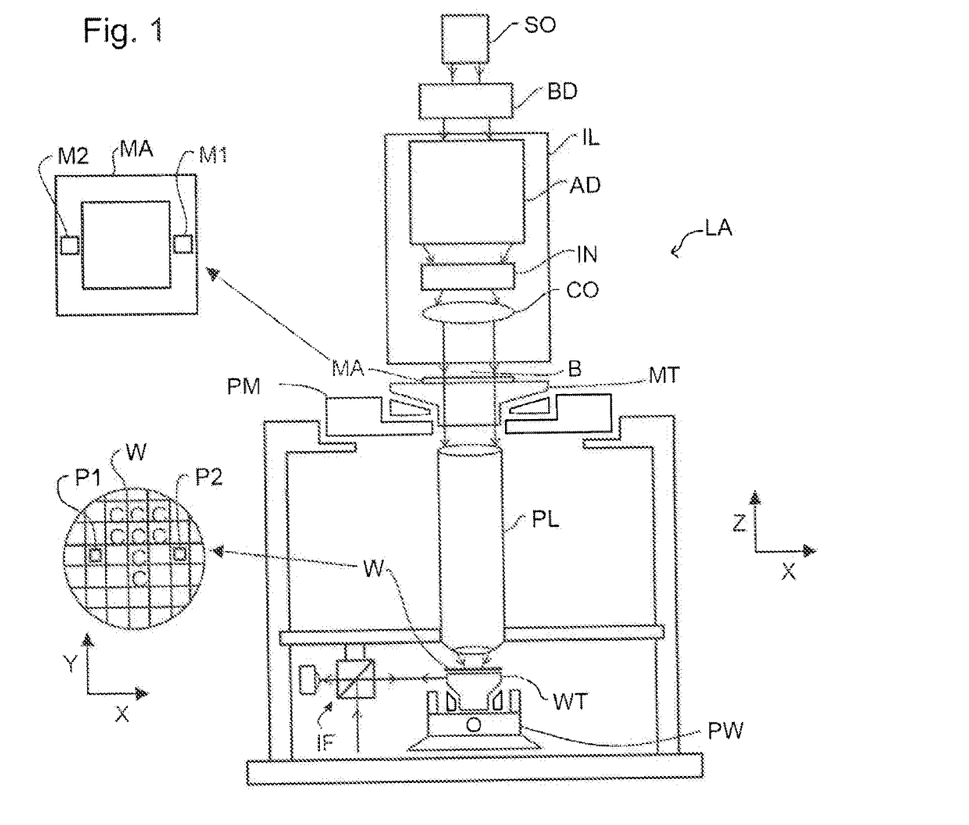
FIG. 1 depicts a lithographic apparatus.

Before describing such embodiments in more detail, however, it is instructive to present an example environment in which embodiments of the present invention may be implemented FIG. 1 schematically depicts a lithographic apparatus. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
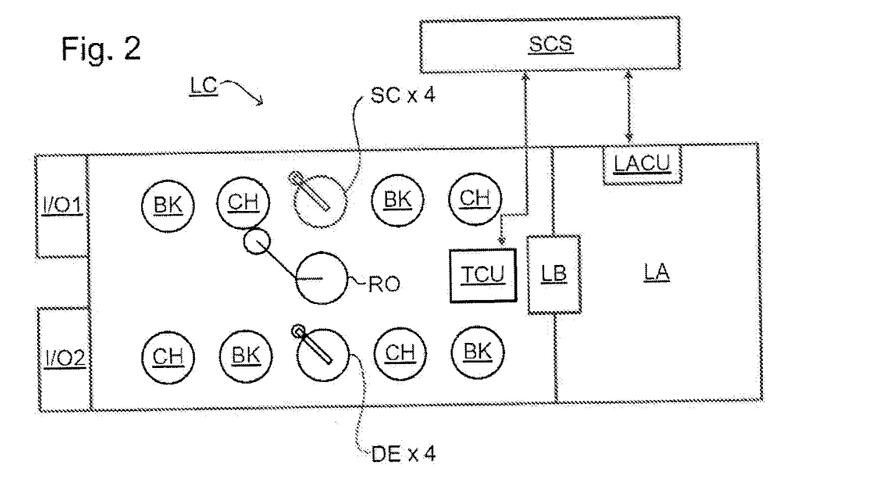
FIG. 2 depicts a lithographic cell or cluster

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
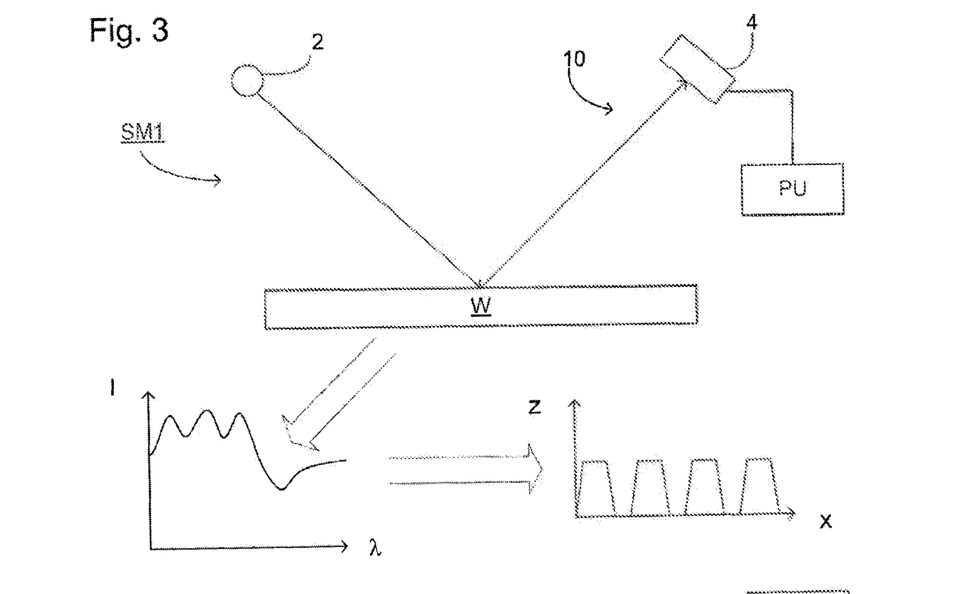
FIG. 3 depicts a first scatterometer.

FIG. 3 depicts a scatterometer which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
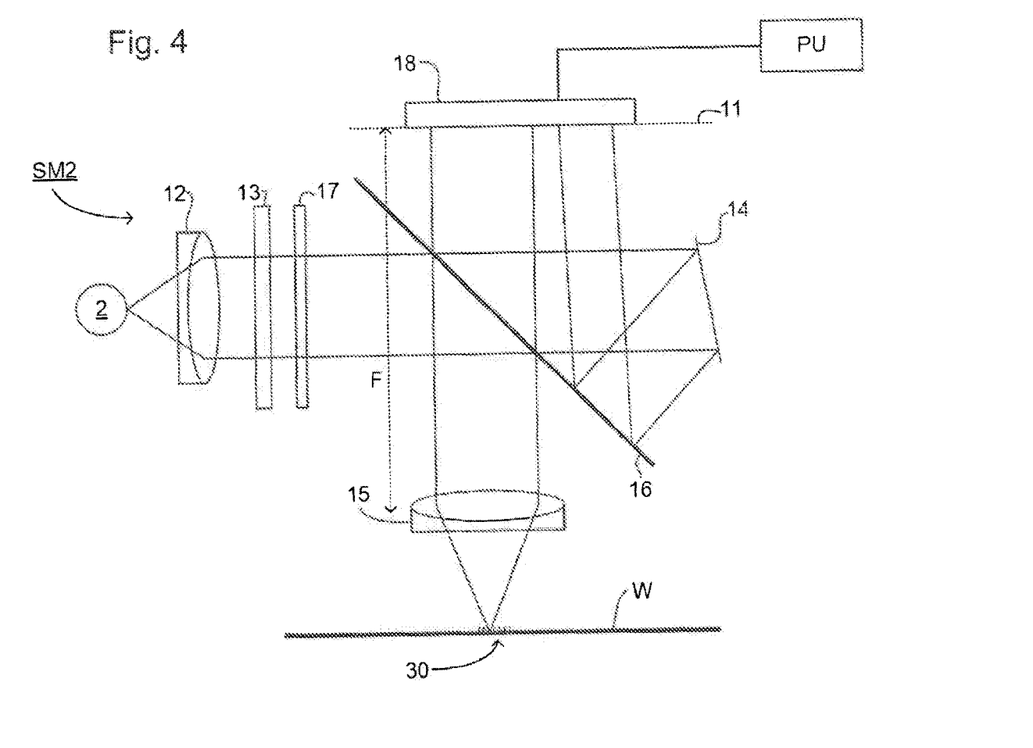
FIG. 4 depicts a second scatterometer.

Another scatterometer that may be used with the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

As described above, the target is on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay metrology. Overlay metrology is a measuring system in which the overlay of two targets is measured in order to determine whether two layers on a substrate are aligned or not. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Using one of the scatterometers described above in combination with modeling of a target structure such as the target 30 and its diffraction properties, measurement of the shape and other parameters of the structure can be performed in a number of ways. In a first type of process, represented by FIG. 5, a diffraction pattern based on a first estimate of the target shape (a first candidate structure) is calculated and compared with the observed diffraction pattern. Parameters of the model are then varied systematically and the diffraction re-calculated in a series of iterations, to generate new candidate structures and so arrive at a best fit. In a second type of process, represented by FIG. 6, diffraction spectra for many different candidate structures are calculated in advance to create a 'library' of diffraction spectra. Then the diffraction pattern observed from the measurement target is compared with the library of calculated spectra to find a best fit. Both methods can be used together: a coarse fit can be obtained from a library, followed by an iterative process to find a best fit.

Figure 5:
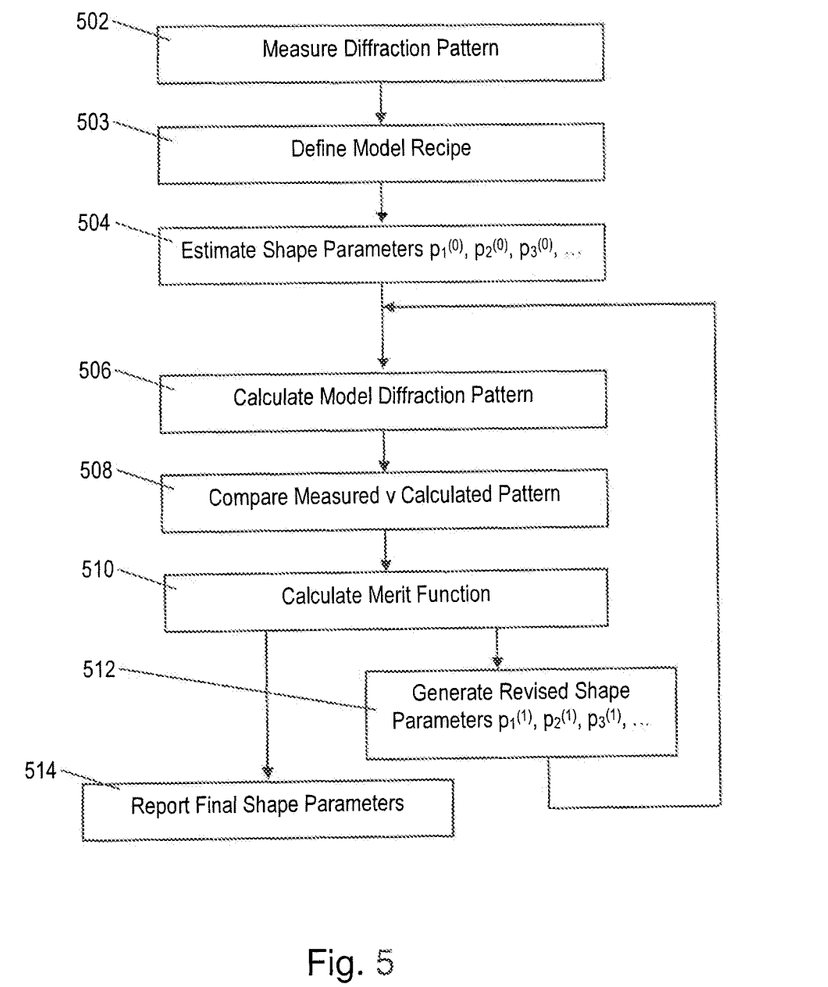
FIG. 5 depicts a first example process for reconstruction of a structure from scatterometer measurements.

Referring to FIG. 5 in more detail, the way the measurement of the target shape and/or material properties is carried out will be described in summary. The target will be assumed for this description to be periodic in only 1 direction (1-D structure). In practice it may be periodic in 2 directions (2-dimensional structure), and the processing will be adapted accordingly.

In step 502: The diffraction pattern of the actual target on the substrate is measured using a scatterometer such as those described above. This measured diffraction pattern is forwarded to a calculation system such as a computer. The calculation system may be the processing unit PU referred to above, or it may be a separate apparatus.

In step 503: A 'model recipe' is established which defines a parameterized model of the target structure in terms of a number of parameters $p_i$ ($p_1$, $p_2$, $p_3$ and so on). These parameters may represent for example, in a 1D periodic structure, the angle of a side wall, the height or depth of a feature, the width of the feature. Properties of the target material and underlying layers are also represented by parameters such as refractive index (at a particular wavelength present in the scatterometry radiation beam). Specific examples will be given below. Importantly, while a target structure may be defined by dozens of parameters describing its shape and material properties, the model recipe will define many of these to have fixed values, while others are to be variable or 'floating' parameters for the purpose of the following process steps. Further below we describe the process by which the choice between fixed and floating parameters is made. Moreover, we shall introduce ways in which parameters can be permitted to vary without being fully independent floating parameters. For the purposes of describing FIG. 5, only the variable parameters are considered as parameters In step 504: A model target shape is estimated by setting initial values $p_i^{(0)}$ for the floating parameters (i.e., $p_1^{(0)}$, $p_2^{(0)}$, $p_3^{(0)}$ and so on). Each floating parameter will be generated within certain predetermined ranges, as defined in the recipe.

In step 506: The parameters representing the estimated shape, together with the optical properties of the different elements of the model, are used to calculate the scattering properties, for example using a rigorous optical diffraction method such as RCWA or any other solver of Maxwell equations. This gives an estimated or model diffraction pattern of the estimated target shape.

In steps 508, 510: The measured diffraction pattern and the model diffraction pattern are then compared and their similarities and differences are used to calculate a "merit function" for the model target shape.

In step 512: Assuming that the merit function indicates that the model needs to be improved before it represents accurately the actual target shape, new parameters $p_1^{(1)}$, $p_2^{(1)}$, $p_3^{(1)}$, etc. are estimated and fed back iteratively into step 506. Steps 506-512 are repeated.

In order to assist the search, the calculations in step 506 may further generate partial derivatives of the merit function, indicating the sensitivity with which increasing or decreasing a parameter will increase or decrease the merit function, in this particular region in the parameter space. The calculation of merit functions and the use of derivatives is generally known in the art, and will not be described here in detail.

In step 514: When the merit function indicates that this iterative process has converged on a solution with a desired accuracy, the currently estimated parameters are reported as the measurement of the actual target structure.

The computation time of this iterative process is largely determined by the forward diffraction model used, i.e., the calculation of the estimated model diffraction pattern using a rigorous optical diffraction theory from the estimated target structure. If more parameters are required, then there are more degrees of freedom. The calculation time increases in principle with the power of the number of degrees of freedom. The estimated or model diffraction pattern calculated at 506 can be expressed in various forms. Comparisons are simplified if the calculated pattern is expressed in the same form as the measured pattern generated in step 502 For example, a modeled spectrum can be compared easily with a spectrum measured by the apparatus of FIG. 3; a modeled pupil pattern can be compared easily with a pupil pattern measured by the apparatus of FIG. 4.

Throughout this description from FIG. 5 onward, the term 'diffraction pattern' will be used, on the assumption that the scatterometer of FIG. 4 is used. The skilled person can readily adapt the teaching to different types of scatterometer, or even other types of measurement instrument.

Figure 6:
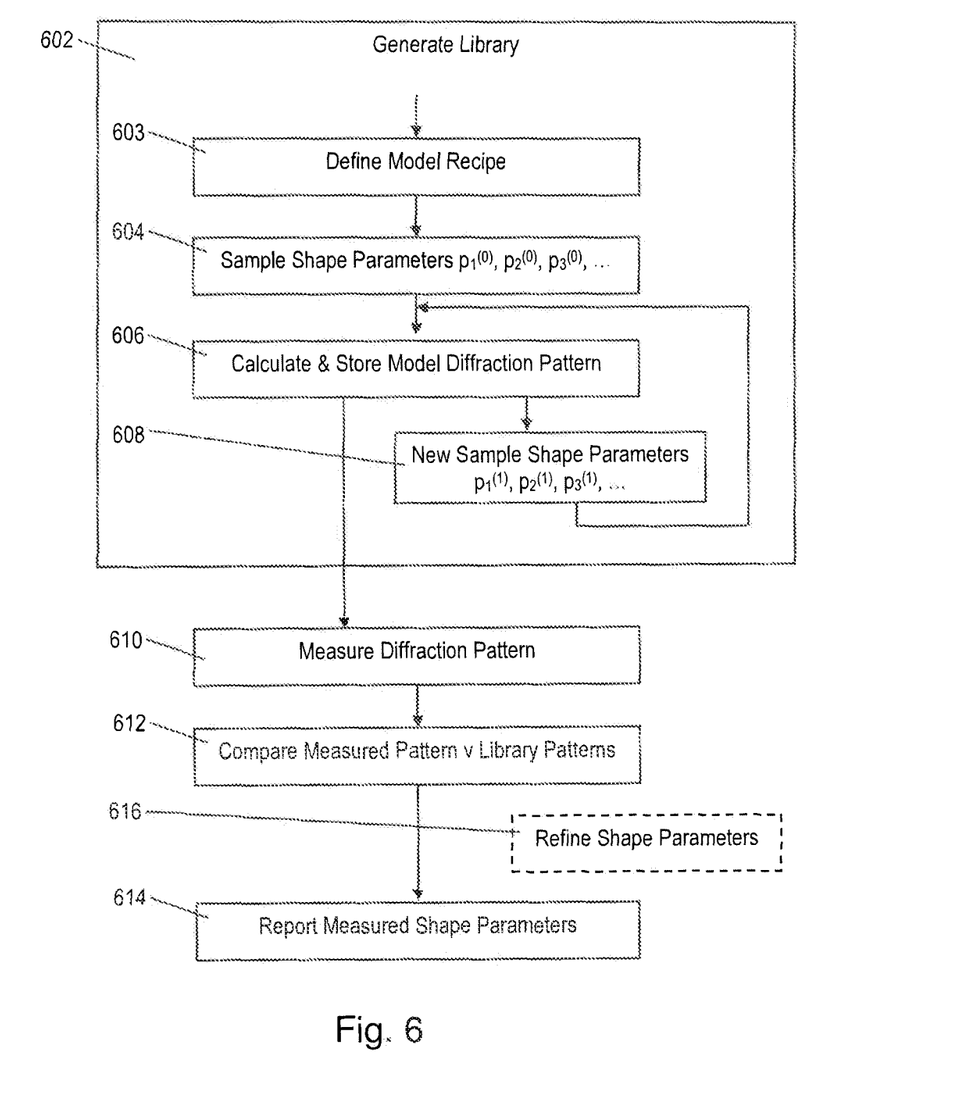
FIG. 6 depicts a second example process for reconstruction of a structure from scatterometer measurements.

FIG. 6 illustrates an alternative example process in which plurality of model diffraction patterns for different estimated target shapes (candidate structures) are calculated in advance and stored in a library for comparison with a real measurement. The underlying principles and terminology are the same as for the process of FIG. 5. The steps of the FIG. 6 process are:

In step 602: The process of generating the library begins. A separate library may be generated for each type of target structure. The library may be generated by a user of the measurement apparatus according to need, or may be pre-generated by a supplier of the apparatus.

In step 603: A 'model recipe' is established which defines a parameterized model of the target structure in terms of a number of parameters $p_i$ ($p_1, p_2, p_3$ and so on). Considerations are similar to those in step 503 of the iterative process.

In step 604: A first set of parameters $p_1^{(0)}, p_2^{(0)}, p_3^{(0)}$, etc. is generated, for example by generating random values of all the parameters, each within its expected range of values.

In step 606: A model diffraction pattern is calculated and stored in a library, representing the diffraction pattern expected from a target shape represented by the parameters.

In step 608: A new set of shape parameters $p_1^{(1)}, p_2^{(1)}, p_3^{(1)}$, etc. is generated. Steps 606-608 are repeated tens, hundreds or even thousands of times, until the library which comprises all the stored modeled diffraction patterns is judged sufficiently complete. Each stored pattern represents a sample point in the multi-dimensional parameter space. The samples in the library should populate the sample space with a sufficient density that any real diffraction pattern will be sufficiently closely represented.

In step 610: After the library is generated (though it could be before), the real target 30 is placed in the scatterometer and its diffraction pattern is measured.

In step 612: The measured pattern is compared with the modeled patterns stored in the library to find the best matching pattern. The comparison may be made with every sample in the library, or a more systematic searching strategy may be employed, to reduce computational burden.

In step 614: If a match is found then the estimated target shape used to generate the matching library pattern can be determined to be the approximate object structure. The shape parameters corresponding to the matching sample are output as the measured shape parameters. The matching process may be performed directly on the model diffraction signals, or it may be performed on substitute models which are optimized for fast evaluation.

In step 616: Optionally, the nearest matching sample is used as a starting point, and a refinement process is used to obtain the final parameters for reporting. This refinement process may comprise an iterative process very similar to that shown in FIG. 5, for example.

Whether refining step 616 is needed or not is a matter of choice for the implementer. If the library is very densely sampled, then iterative refinement may not be needed because a good match will always be found. On the other hand, such a library might be too large for practical use. A practical solution is thus to use a library search for a coarse set of parameters, followed by one or more iterations using the merit function to determine a more accurate set of parameters to report the parameters of the target substrate with a desired accuracy. Where additional iterations are performed, it would be an option to add the calculated diffraction patterns and associated refined parameter sets as new entries in the library. In this way, a library can be used initially which is based on a relatively small amount of computational effort, but which builds into a larger library using the computational effort of the refining step 616. Whichever scheme is used, a further refinement of the value of one or more of the reported variable parameters can also be obtained based upon the goodness of the matches of multiple candidate structures. For example, the parameter values finally reported may be produced by interpolating between parameter values of two or more candidate structures, assuming both or all of those candidate structures have a high matching score.

The computation time of this iterative process is largely determined by the forward diffraction model at steps 506 and 606, i.e., the calculation of the estimated model diffraction pattern using a rigorous optical diffraction theory from the estimated target shape.

The concepts disclosed herein rely on comparing an unknown diffracting structure's optical response signature (so-called scatter/diffraction signature, or scatter/diffraction spectrum, or pupil image or any other suitable signature) to certain incident radiation with a set of signatures of known structures; the best-fit between the two is assumed to "reconstruct" the unknown one. In the study below, the "unknown object" will be a photoresist grating having the following characteristics (although of course this is an example only, and other suitable objects are equally applicable): period (pitch) of 100 nm, line width (CD) of 50 nm, line height (h) of 60/75/90 nm, and BARC (bottom anti-reflection coating) layer of 40 nm under the lines.

Also for the study, a roughness is applied to both edges of a line being studied which produces a mean (principal) CD of 50 nm. In contrast to the generally accepted definition in the following discussion roughness is quantified by its one sigma RMS variation.

Figure 7A:
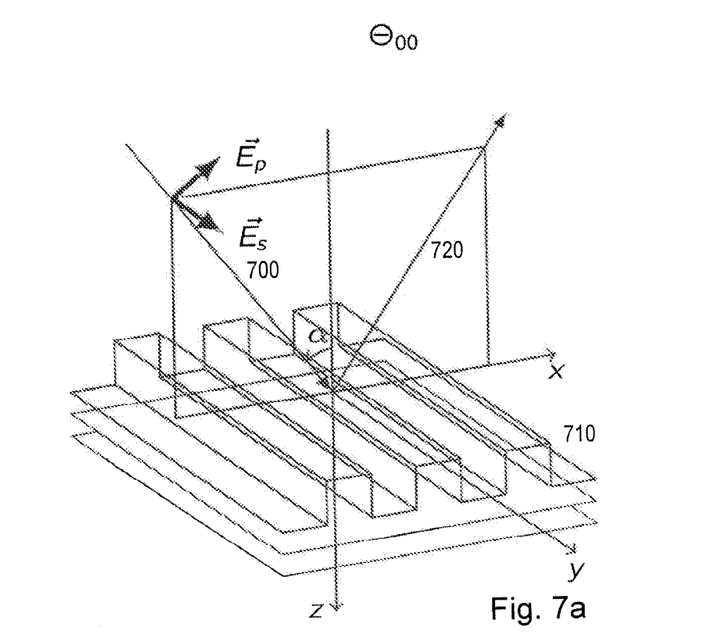
FIGS. 7a and 7b illustrate two measurement arrangements according to embodiments of the invention.
Figure 7B:
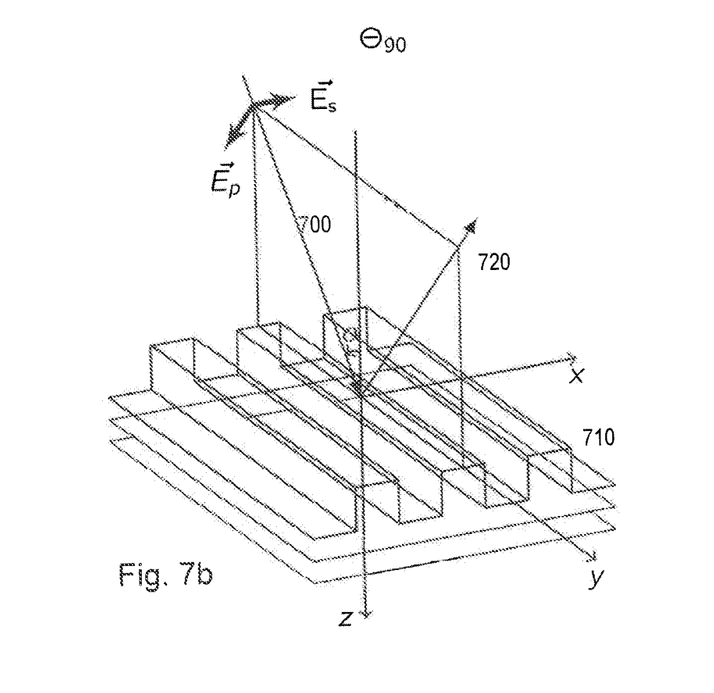

FIGS. 7a and 7b illustrate the two set-ups: ⊖00 and ⊖90 which are employed to investigate the LER gratings. Both show incident ray 700, incident on grating 710 at angle α, and reflected ray 720. FIG. 7a shows the ⊖00 set-up in which the s-polarized light $E_s$ is y-polarized and the p-polarized light $E_p$ lays in the x-z plane, in the coordinate system shown. Similarly, FIG. 7b shows the ⊖90 set-up in which the s-polarized light $E_s$ is x-polarized and the p-polarized light $E_p$ lays in the y-z plane.

At any time the illumination wavelength used is greater than 320 nm. From the grating's pitch of 100 nm it follows that only zeroth diffraction order is propagating, and therefore in reflection "diffracted" equals "reflected" (see FIGS. 7a and 7b). Two variants of each set-up are considered: fixed wavelength γ with floating incidence angle α (variable-angle scatterometry), and fixed incidence angle α with floating wavelength γ (fixed-angle scatterometry).

In each case "scatter signature" means reflected intensity as a function of either incidence angle α or wavelength γ.

First of all, it can be shown that there is hardly any difference between the scatter signature of a grating with principal CD of 50 nm with LER on its edges (hereafter referred to as "LER+CD50") and the scatter signature of a (perfect) grating with CD of 50 nm without LER (hereafter referred to as "CD50", similarly a grating with a CD of 49 nm will be referred to as CD49 etc.). Upon closer observation, however, a pattern emerges. This can be observed when plotting LER+CD50's scatter signatures on top of a family of signatures of "perfect" (that is no LER) gratings with (for example) CDs between 49.0 nm to 51.0 nm, at 0.1 nm intervals. For each member of the family only the CD changes; the pitch is always 100 nm. In doing this, it can be seen that the signature of grating LER+CD50 does not follow the signature of grating CD50.

It can be further shown that the signatures have essentially the same shape, but are offset by one another, so that (for example) where σ=1, a grating with LER+CD50 can be best-fit to CD49.9 whereas where σ=3 a grating with LER+CD50 can be best-fit to CD49.3 (if approximated to discrete family members). This effect appears to be global in nature, yet the same offset in CD is not observed for both the set-ups ⊖00 and ⊖90 of FIGS. 7a and 7b. The family of CD49.0, CD49.1, ... CD50.9, CD51's signatures is fairly linear, so for any new data point the best-fitting CD can be calculated, e.g., since σ=2 LER+CD50 is exactly between CD49.7 and CD49.6 it can be interpolated to the best-fitting CD49.65.

It particularly notable that the observed effect is anisotropic, such that, depending on the incident polarization (either $E_y$ or $E_x$) the same grating LER+CD50 is interpolated to a CD either higher or lower than that of a "perfect" CD50 grating. Also, the more LER is applied to the grating the more offset from CD50 the interpolated CD is. Furthermore, the observed effect seems to be of global nature such that, for a fixed polarization and for any incidence angle, the results of interpolation are the same (as long singularities are avoided for any resist height). As a result, for a given polarization and LER amount a single effective-CD can be assigned. Therefore, the effective-CD does not depend on the wavelength.

The observed effect means that it is not possible to detect LER using just one scatterometric measurement. For instance, the σ=3 for grating LER+CD50 under $E_y$ illumination always exhibits the effective-CD of 49.3 nm, rendering it indistinguishable from the perfect grating with 100 nm pitch and Critical Dimension of 49.3 nm. Consequently the proposed methods disclosed herein propose using a second polarization ($E_x$ in this example), from which it is possible to observe that the grating is no longer CD49.3, since now it acts as CD50.4. For this reason the conclusion follows that polarization discrimination is important in scatterometric LER metrology. Only through including a second polarization into the scatterometric measurement is it possible to detect the change in the effective-CD, which in turn can be related to the magnitude of LER.

Figure 8:
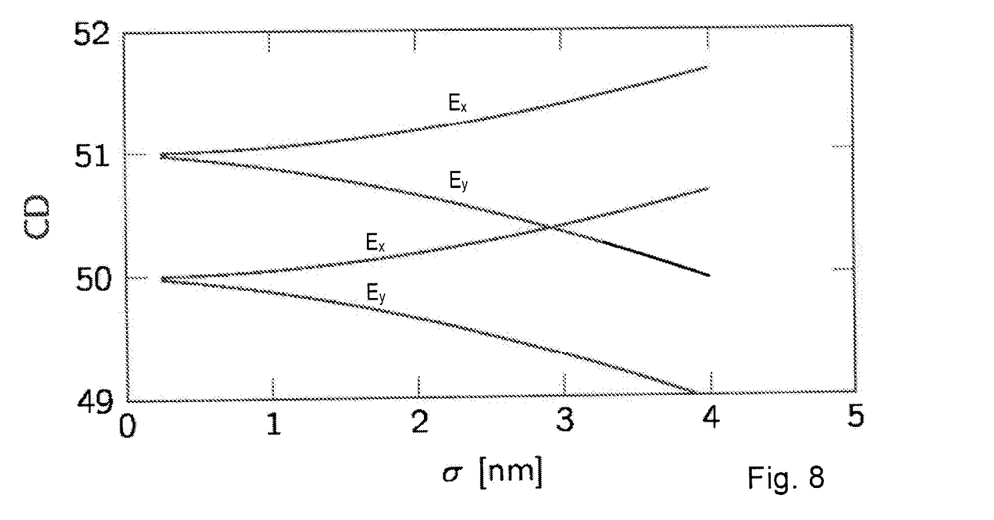
FIG. 8 is a graph illustrating the relationship between effective-CD and LER.

FIG. 8 illustrates the relationship between the effective-CD and LER. It appears to be constant for all CDs of approximately 50 nm. As already stated, the more LER is applied to the grating the lower (under Ey illumination) or the higher (under $E_x$ illumination) effective-CD grating it seems to be. The exact relationship between the effective-CD (ECD) and LER (or, more specifically, σ) can be best-fit to the following polynomial:

$$ECD = a\sigma^2 + b\sigma + CD_0 \quad (1)$$

with: a=−0.041, b=−0.097 for $E_y$
a=+0.039, b=+0.014 for $E_x$
and $CD_0$ being the CD of a "perfect" grating without LER.

The above polynomials have been determined using just one set of parameters, however from the observation that the effective-CD is constant, it can be expected that the polynomials would also look alike for any other parameters. This is why it is assumed that the polynomials are a general description of effective-CD to LER relationship. What is more, it can be seen from FIG. 8 that for the selected configuration, two gratings have been tested—CD50 and CD51. Various amounts of LER have been applied to both and respective effective-CDs have been determined. It can be seen that there is virtually no difference between the two sets of polynomials. For this reason it seems reasonable to assume that polynomials are general not only for all sets of parameters, but also for all CDs close to 50 nm. This is why LER applied to CD49 is also expected to deliver very similar polynomials.

In light of the above, and referring to the scatterometric setup of FIG. 3 or 4, the proposed method comprises illuminating the target object W (a grating) using illumination having an electrical vector that is parallel to the lines of the object, in an arrangement such as that depicted in either FIG. 5 or FIG. 6. Then, with the same or different setup, illuminating the same target W using illumination having an electrical vector that is perpendicular to the grating's lines. On analysing the optical response signatures of both of these measurements, it will be seen that the former optical response signature can be closely fitted to the optical response signature of a perfect grating having a CD less than that of the nominal CD of object W, while similarly the latter optical response signature can be closely fitted to the optical response signature of a perfect grating having a CD more than that of the nominal CD of object W.

From these effective CDs, using equation 1 with the coefficients corresponding to the polarization used, the amount of LER can be calculated. Also, by substituting the resulting LER back into equation 1, the correct CD in the presence of LER can be determined.

When referring to the different polarizations of the incident light for the two measurements, what is being referred to is the orientation of the light's electrical vector in relation to the object being measured. For reasons explained below, it can be shown that sensitivity is low for the light designated as "p-polarized" in FIGS. 7a and 7b, that is the light polarized in the plane of incidence of the beam. Consequently, the method is advantageously performed by obtaining both of the two measurements required from s-polarized light (light polarized in the plane normal to the plane of incidence). Therefore, for example, the method may be performed by obtaining a first measurement using s-polarized light in the arrangement of FIG. 7a and obtaining a second measurement using s-polarized light in the arrangement of FIG. 7b.

It should also be appreciated that the two measurements necessary can be obtained from a single, elliptically polarized beam, with the different polarizations separated after reflection. While applicable to the scatterometer of FIG. 4, this is particularly relevant for the scatterometer of FIG. 5 as this allows the target to be illuminated from different directions. Therefore arrangements equivalent to both of FIGS. 7a and 7b can be obtained, and both measurements can be obtained using only s-polarized light.

As already pointed out, the family of scatter signatures exhibits a fair linearity, which is why the following proportionality approximately holds:

$$(R_S^{(49)} - R_S^{(51)})/(49-51) = (R_S^{(50)} - R_S^{(51)})/(50-51)$$

It follows that:

$$(R_S^{(49)} - R_S^{(51)})/(R_S^{(50)} - R_S^{(51)}) = (49-51)/(50-51)$$

Where $R_S$ is the diffracted intensity

Figure 9:
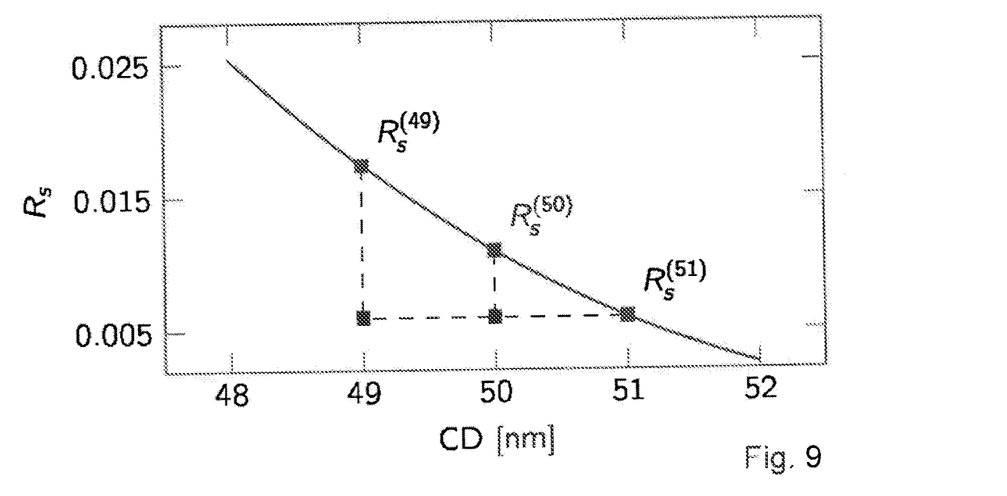
FIG. 9 is a graph illustrating the relationship between diffractive intensities and CD.
Figure 10:
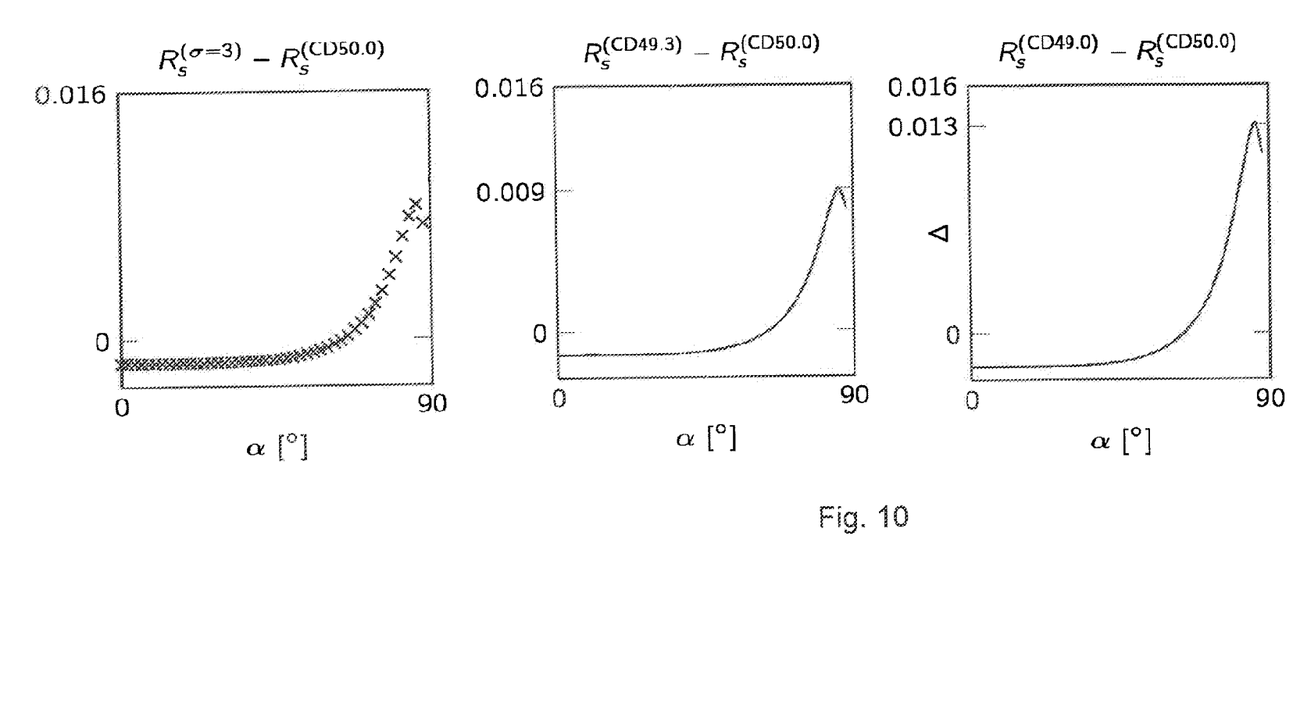
FIG. 10 shows three graphs which illustrate a method of evaluating scatterometry's sensitivity to LER described by effective-CD.

Knowing that the effective-CD for σ=3 LER+CD50 under $E_y$ illumination is 49.3 nm it is possible to determine that the difference between the signatures of the grating and CD50 is 0.7 of the difference between the signatures of CD49 and CD50 (by replacing, in the above formula: 50 with 49.3, 51 with 50). This is illustrated in FIG. 9 which shows that the relationship between diffracted intensities $R_S$ and CD is nearly linear; and FIG. 10, which shows that, when the proportionality factor between CD49.3–CD50.0 and CD49–CD50 is known (0.7), it is possible to predict that the proportionality between the difference in signatures will be the same (e.g., the maximal differences: 0.013 and 0.009; 0.009/0.013=0.692).

This observation establishes a simple method of evaluating scatterometry's sensitivity to Line Edge Roughness described by the effective-CD (ECD), if sensitivity is defined as the difference between the CD50+LER's and CD50's signatures. If the ECD is 49.3 nm, the last formula (after the suggested replacements) can be rewritten into:

$$R_S^{ECD} - R_S^{(51)} = \frac{ECD - 50}{49 - 50}(R_S^{(49)} - R_S^{(50)})$$

which means that the sensitivity (here: $R_S^{ECD}-R_S^{(51)}$) can be estimated using the difference $\Delta$ between two "neighboring" gratings' signatures (here: CD49 and CD50) which is multiplied by the following "scaling factor" $c_f$:

$$c_f = \frac{ECD - 50}{49 - 50}$$

Knowing $\Delta$ and the effective-CD linked with LER one the sensitivity s can be estimated as:

$$s = c_f \Delta$$

From the differences $\Delta$ for variable-angle variants of both set-ups depicted in FIGS. 7a and 7b the following conclusions can be drawn: high sensitivity is located in the area of high incidence angles, p-polarization in $\ominus$00 and $\ominus$90 set-ups generally delivers little sensitivity, and s-polarization still delivers little sensitivity for certain sets h:γ

Consequently it is advantageous to use s-polarization and high incidence angles to determine the effective-CD. Also, observed "singularities" can be seen to correspond to local minima in s-polarization $\Delta$ plots.

It has been shown that: detectability of LER depends on its amount, difference in effective-CDs needs to be observed using two polarizations of incident light, the effective-CD is linked to σ, with weak dependence on resist height, wavelength, incidence angle, difference in effective-CDs can be translated into information about the amount of LER, and despite the two different effective-CDs the principal CD can be reconstructed properly.

To illustrate the methodology proposed herein based upon the above analysis, consider observing the scatter signatures of an unknown object under light of two different polarizations and noting that the scatter signatures correspond to the following effective CDs: CD49.2 under $E_y$ radiation and CD49.6 under $E_x$ radiation On observing these effective CDs, the LER parameter a can be determined using equation (1) above for both the effective CDs and the corresponding coefficients for the light polarity. Once this is done, it is a simple matter of substituting the LER parameter back in the equation to calculate the principal CD. On doing this it can be found that the principal CD is 49.5 nm and LER σ is 1.66.

The method may be performed with a floating incidence angle with wavelength fixed or floating wavelength with incidence angle fixed. As previously described, sensitivity is improved with larger incidence angles, such as those above 70 degrees. In both cases two incident polarizations are considered ($E_x$ and $E_y$), so consequently four signatures $R_s^u$ of the unknown grating are recorded. Each one is compared with the corresponding family (h:CD) of line gratings' signatures:

$$E = RMS(R_s^u - R_s^{h:CD})$$

creating a 2D map of h:CD's best-fit. The minima show the resist height h=71 nm and the predicted effective-CDs. This is why, so long as it is possible to detect that effective-CD appears to be different when using two polarizations, it is possible to detect LER.

To summarize the above, disclosed is the use of a scatterometer, such as one of those shown in FIG. 3 or 4 and described above, such that, for every target 30 on substrate W two measurements are performed using two orthogonal polarization states of radiation from radiation projector 2. The polarization may be, for example, either perpendicular or parallel to the lines of target object 30, if it happens to be a 1D or 2D grating of lines' width CDx. Using the methods described above, for two measurements, two results will be obtained. If the above-mentioned grating is carrying LER, these measurements will display a specific offset from CDx, pictured in FIG. 8. In general, the offset has a parabolic dependency on LER with both parabolas starting at CDx, that is the target's dimension whose LER=0. The coefficients of parabolas can be assumed to be known, so their precise equations can de derived. Using them, two observed offsets can be translated into specific value of LER on the target object 30. From this the correct CD is the presence of LER can be determined.

It is worth noting that the frequency content of a rough line resembles the spectral look of a low-pass filter with a cut-off frequency ζ0 and log-log slope m. In the above main embodiments it has been assumed that these parameters have been fixed (ζ0=0.01–1/nm, m=−3), as these values have been observed as typical.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents

The invention claimed is:

1. A method comprising:
   obtaining a first optical response signature from a first radiation beam reflected from an object, the first radiation beam being polarized with a first electrical vector in a first orientation relative to the object;
   obtaining a second optical response signature from a second radiation beam reflected from the object, the second radiation beam being polarized with a second electrical vector in a second orientation relative to the object;
   determining a first effective critical dimension (ECD) and a second ECD of the object based on the first and second optical response signatures, respectively; and
   determining a parameter related to edge roughness of the object based on the first ECD and the second ECD.

2. The method of claim 1, further comprising:
   comparing the first and second optical response signatures; and
   determining a difference between the first and second optical response signatures.

3. The method of claim 1, further comprising:
   comparing the first and second optical response signatures to a plurality of predefined optical response signatures obtained from a plurality of objects, wherein each object of the plurality of objects comprises:
   a smooth edge; and
   a critical dimension that is different from other objects in the plurality of objects.

4. The method of claim 3, wherein:
   each predefined optical response signature of the plurality of optical response signatures comprises a curve shape that is substantially similar to other predefined optical response signatures of the plurality of optical response signatures; and
   each predefined optical response signature of the plurality of optical response signatures is offset from other predefined optical response signatures of the plurality of optical response signatures.

5. The method of claim 3, wherein:
   the first ECD is determined based on the comparison of the first optical response signature to the plurality of predefined optical response signatures; and
   the second ECD is determined based on the comparison of the second optical response signature to the plurality of predefined optical response signatures.

6. The method of claim 3, wherein:
   the first ECD is determined based on a first predefined optical response signature of the plurality of predefined optical response signatures that best matches the first optical response signature; and
   the second ECD is determined based on a second predefined optical response signature of the plurality of predefined optical response signatures that best matches the second optical response signature.

7. The method of claim 1, wherein the determining of the parameter related to the edge roughness of the object comprises numerically solving, using a processing device, a first equation and a second equation, wherein:
   the first equation comprises:
   the first ECD, and
   a first coefficient corresponding to the first optical response signature; and the second equation comprises:
   the second ECD; and
   a second coefficient corresponding to the second optical response signature.

8. The method of claim 1, further comprising predetermining a first function and a second function, wherein:
   the first and second functions, are defined in terms of the parameter related to the edge roughness of the object; and
   the predetermining comprises:
   obtaining, a third optical response signature and a fourth optical response signature from another object having a known critical dimension; and
   determining a third ECD and a fourth ECD based on the third and fourth optical response signatures, respectively.

9. The method of claim 1, wherein:
   the first radiation beam is incident on the object along a first incidence, direction in the first orientation;
   the second radiation beam is incident on the object along a second incidence direction in the second orientation;
   the first incidence direction is in a first plane of incidence;
   the second, incidence direction is in a second plane of incidence;
   the first incidence direction is rotated with respect to the second incidence direction relative to the object;

the first radiation beam is polarized in a first plane normal to the first plane of incidence; and the second radiation beam is polarized in a second plane normal to the second plane of incidence.

10. The method of claim 1, wherein the object comprises a photoresist grating.

11. The method of claim 1, wherein:
the first or second radiation beam is incident on a surface plane of the object; and
an incidence angle of the first or second radiation beam, relative to an axis of the object perpendicular to the surface plane is greater than 60 degrees.

12. The method of claim 1, wherein:
the first or second radiation beam is incident on a surface plane of the object; and
an incidence angle of the first or second radiation beam relative to an axis of the object perpendicular to the surface plane is greater than 70 degrees.

13. The method of claim 1, comprising:
obtaining the first optical response signature from a first beam component, wherein:
the first beam component is separated from an elliptically polarized beam reflected from the object, and
the first beam component is polarized in the first orientation relative to the object; and
obtaining the second optical response signature from a second beam component, wherein:
the second beam component is separated from elliptically polarized beam reflected from the object; and
the second beam component is polarized in the second orientation relative to the object.

14. The method of claim 1, further comprising determining a correct critical dimension of the object from the parameter related to the edge roughness of the object.

15. The method of claim 1, wherein the first and second orientations are orthogonal to each other.

16. The method of claim 1, wherein:
the first ECD is smaller than an actual critical dimension of the object; and
the second ECD is larger than the actual critical dimension of the object.

17. An inspection apparatus comprising:
a controller configured to:
reflect a radiation beam off an object;
obtain a first optical response signature from the radiation beam reflected from the object, the radiation beam being polarized with a first electrical vector in a first orientation relative to the object;
obtain a second optical response signature from the radiation beam reflected from the object, the radiation beam being polarized with a second electrical vector in a second orientation relative to the object;
determine a first effective critical dimension (ECD) and a second ECD of the object based on the first and second optical response signatures, respectively; and
determine a parameter related to edge roughness of the object based on the first ECD and the second ECD.

18. A non-transitory computer-readable storage device having instructions stored thereon, execution of which, by a computing device, causes the computing device to perform operations comprising:
obtaining a first optical response signature from a radiation beam reflected from the object, the radiation beam being polarized with a first electrical vector in a first orientation relative to the object;
obtaining a second optical response signature from the radiation beam reflected from the object, the radiation beam being polarized with a second electrical vector in a second orientation relative to the object;
determining a first effective critical dimension (ECD) and a second ECD of the object based on the first and second optical response signatures, respectively; and
determining a parameter related to edge roughness of the object based on the first ECD and the second ECD.

* * * * *

UNITED STATES PATENT AND TRADEMARK OFFICE
CERTIFICATE OF CORRECTION

PATENT NO. : 8,804,123 B2  
APPLICATION NO. : 13/458116  
DATED : August 12, 2014  
INVENTOR(S) : Osten et al.

Page 1 of 1

It is certified that error appears in the above-identified patent and that said Letters Patent is hereby corrected as shown below:

In the Claims

Column 18, line 60, claim 9, delete ",".
Column 18, line 64, claim 9, delete ",".
Column 19, line 11, claim 11, delete ",".
Column 19, line 29, claim 13, after "separated from" insert --the--.

Signed and Sealed this
Seventeenth Day of February, 2015

Michelle K. Lee
*Deputy Director of the United States Patent and Trademark Office*